(12) United States Patent
Han

(10) Patent No.: US 8,586,983 B2
(45) Date of Patent: Nov. 19, 2013

(54) SEMICONDUCTOR CHIP EMBEDDED WITH A TEST CIRCUIT

(76) Inventor: Kwon Whan Han, Seoul (KR)

(*) Notice: Subject to any disclaimer, the term of this patent is extended or adjusted under 35 U.S.C. 154(b) by 34 days.

(21) Appl. No.: 12/980,843

(22) Filed: Dec. 29, 2010

(65) Prior Publication Data

US 2011/0254000 A1  Oct. 20, 2011

(30) Foreign Application Priority Data

Apr. 15, 2010  (KR) .................. 10-2010-0034737

(51) Int. Cl.
*H01L 23/58* (2006.01)

(52) U.S. Cl.
USPC ............ 257/48; 257/621; 257/686; 257/737; 257/773; 257/774; 257/777; 257/E23.011; 257/E21.597; 257/E25.013; 257/E21.705; 324/750.3; 324/762.01; 324/762.05; 438/14; 438/17; 438/18; 438/667

(58) Field of Classification Search
USPC ............ 257/48, E21.521–E21.523, 257/E21.525–E21.526, 621, 686, 737, 773, 257/774, 777, E23.011, E21.597, E25.013, 257/E21.705; 324/750.3, 762.01, 762.05; 438/14, 17, 18, 667
See application file for complete search history.

(56) References Cited

U.S. PATENT DOCUMENTS

| | | | |
|---|---|---|---|
| 2004/0161865 A1* | 8/2004 | Yu et al. | 438/14 |
| 2005/0127529 A1* | 6/2005 | Huang et al. | 257/779 |
| 2009/0153177 A1* | 6/2009 | Shibata | 324/765 |
| 2011/0084721 A1* | 4/2011 | Hamaguchi | 324/756.02 |

FOREIGN PATENT DOCUMENTS

| | | | |
|---|---|---|---|
| JP | 2002076075 A | | 3/2002 |
| JP | 2008294127 A | | 12/2008 |
| KR | 100621438 B1 | | 8/2006 |
| WO | 2009139070 A1 | | 11/2009 |
| WO | WO 2009139070 A1 * | | 11/2009 |

* cited by examiner

*Primary Examiner* — Ermias Woldegeorgis
(74) *Attorney, Agent, or Firm* — William Park & Associates Patent Ltd.

(57) ABSTRACT

A semiconductor chip includes a semiconductor chip body having a first surface on which pad parts are formed and an opposing second surface. Through-electrodes may be connected to the pad parts and formed to pass through the semiconductor chip body. Determination units may be connected to the through-electrodes and may be enabled to determine whether the pad parts and the through-electrodes are electrically connected with each other.

15 Claims, 9 Drawing Sheets

SEMICONDUCTOR CHIP EMBEDDED WITH A TEST CIRCUIT

CROSS-REFERENCE TO RELATED APPLICATIONS

The present application claims priority to Korean patent application number 10-2010-0034737 filed on Apr. 15, 2010, which is incorporated herein by reference in its entirety.

BACKGROUND OF THE INVENTION

The present invention relates to a semiconductor chip embedded with a test circuit.

As semiconductor device manufacturing technology has developed, semiconductor packages having semiconductor devices have been increasingly capable of processing an increased amount of data.

Semiconductor packages are manufactured through a semiconductor chip manufacturing process for manufacturing semiconductor chips on a wafer made of silicon with high purity, a die sorting process for electrically inspecting the semiconductor chips, and a packaging process for packaging good quality semiconductor chips.

In semiconductor packages, it is the norm that electrical connections are formed using metal wires.

However, use of metal wires may introduce problems in the semiconductor packages. For example, there may be degradation of signal integrity due to close proximity of the metal wires. Therefore, to help suppress the electrical characteristics of the semiconductor packages from being degraded, and enable the miniaturization of the semiconductor packages, there has been increasing use of through-electrodes.

In semiconductor packages using the through-electrodes, the electrical degradation of the semiconductor packages is substantially prevented, operation speeds of the semiconductor chips are improved, and it is possible to achieve further miniaturization of the semiconductor packages.

In general, a semiconductor chip using through-electrodes has an increased number of pads when compared to a semiconductor chip not using through-electrodes. This resulting pitch decrease may present problems. For example, when performing a test, an existing probe type may encounter difficulties because a semiconductor chip may have too fine a pitch. In particular, in a wafer having memory chips for high speed operation, since several hundreds or several thousands of pads are internally connected with one another, it may be impossible to separately perform tests for electrical connections between the pads and the through-electrodes.

Efforts have been made to manufacture separate test boards. However, this may lead to problems such as excessive lead time and cost to manufacture the test equipment.

BRIEF SUMMARY OF THE INVENTION

Embodiments of the present invention are directed to a semiconductor chip embedded with a test circuit capable of determining whether a pad part and a through-electrode are electrically connected with each other.

In one embodiment of the present invention, a semiconductor chip includes a semiconductor chip body having a first surface on which pad parts are formed and an opposing second surface. Through-electrodes may be connected to the pad parts and formed to pass through the semiconductor chip body. Determination units may be connected to the through-electrodes and may be enabled to determine whether the pad parts and the through-electrodes are electrically connected with each other.

Each determination unit may include a determination element disposed on at least one of the first surface and the second surface of the semiconductor chip body. A test connection line may connect the determination element to a corresponding through-electrode.

The determination element may include any one of a light emitting element, a thermoelectric element, and a piezoelectric element.

The test connection line may include a first test connection line connecting one end of the determination element to the corresponding through-electrode, and a second test connection line for grounding the determination element.

In another embodiment of the present invention, a semiconductor chip includes a semiconductor chip body having a first surface on which pad parts are formed and an opposing surface, connection lines connecting the pad parts with one another. Test pads may be disposed under the pad parts in the semiconductor chip body and through-electrodes may be connected to the pad parts and formed to extend from the second surface of the semiconductor chip body through the test pads. The semiconductor chip body may comprise determination units enabled to determine whether the pad parts and the through-electrodes are electrically connected with each other.

Each determination unit may include a determination element disposed on at least one of the first surface and the second surface of the semiconductor chip body. A test connection line may connect the determination element to a corresponding test pad.

The determination element may include any one of a light emitting element, a thermoelectric element, and a piezoelectric element.

The test connection line may include a first test connection line connecting the determination element to the corresponding through-electrode and a second test connection line grounding the determination element.

The connection lines may be disposed in a serial pattern when viewed from the top, and the pad parts may be daisy chained via the connection lines.

The connection lines may include fuse circuits. The connection lines may be selectively cut through laser cutting or electrical cutting.

The semiconductor chip body may have openings to expose portions of test connection lines so that they may be cut.

In another embodiment of the present invention, a semiconductor chip may include a semiconductor chip body having a first surface on which pad parts are formed and an opposing second surface. Connection lines may connect the pad parts with one another. Test pads may also be formed on the second surface of the semiconductor chip body. Through-electrodes may be connected to the pad parts and formed to extend from the second surface of the semiconductor chip body through the test pads. Determination units may be enabled to determine whether the pad parts and the through-electrodes are electrically connected with each other.

Each determination unit may include a determination element disposed on at least one of the first surface and the second surface of the semiconductor chip body. A test connection line may connect the determination element to a corresponding through-electrode.

The determination element may include any one of a light emitting element, a thermoelectric element, and a piezoelectric element.

The test connection line may include a first test connection line connecting the determination element to the corresponding through-electrode, and a second test connection line may ground the determination element.

The connection lines may be disposed in a serial pattern when viewed from the top, and the pad parts may be daisy chained via the connection lines.

The connection lines may include fuse circuits that may be cut through laser cutting or electrical cutting.

The through-electrodes may be applied with data signals or power signals.

The semiconductor chip may further include repair through-electrodes.

The through-electrodes and the repair through-electrodes may be formed to be connected with each other.

DESCRIPTION OF SPECIFIC EMBODIMENTS

The present invention provides a semiconductor chip in which a determination unit may be connected with a through-electrode so that it may be possible to test whether the through-electrode and a corresponding pad part are electrically connected with each other.

Specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
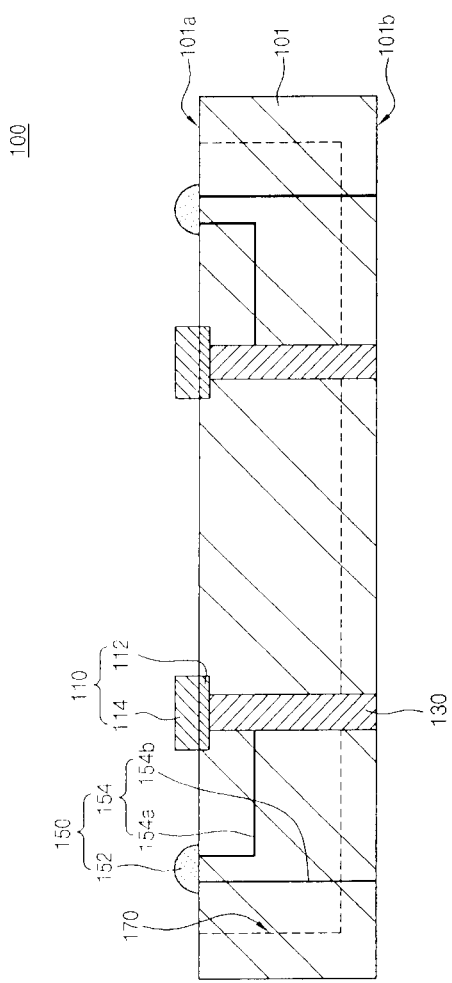
FIG. 1 is a cross-sectional view illustrating a semiconductor chip in accordance with an embodiment of the present invention.

FIG. 1 is a cross-sectional view illustrating a semiconductor chip in accordance with an embodiment of the present invention.

Referring to FIG. 1, there is shown a semiconductor chip 100 comprising a semiconductor chip body 101, through-electrodes 130, and determination units 150.

The semiconductor chip body 101 has a top surface 101a and a bottom surface 101b. The semiconductor chip body 101 includes pad parts 110 disposed on the top surface 101a and a circuit unit 170 connected with the pad parts 110.

Each pad part 110 can include a bonding pad 112 disposed on the top surface 101a and a connection member 114 formed on the bonding pad 112. The connection member 114 may be, for example, a solder or a bump. The circuit unit 170 can include a data storage section (not shown) for storing data and a data processing section (not shown) for processing the data stored in the data storage section.

The through-electrodes 130 are formed through the semiconductor chip body 101 to be connected to the pad parts 110. The through-electrodes 130 can be formed to extend from the bottom surface 101b to the top surface 101a of the semiconductor chip body 101. The pad parts 110 can also be disposed on the bottom surface 101b. In this case, the through-electrodes 130 can be formed to extend from the top surface 101a to the bottom surface 101b of the semiconductor chip body 101.

The determination units 150 are connected to the through-electrodes 130 and may function to determine whether the pad parts 110 and the through-electrodes 130 are electrically connected with each other. Each determination unit 150 includes a determination element 152 disposed on either the top surface 101a or the bottom surface 101b, and a test connection line 154 connecting the determination element 152 to the through-electrode 130.

The test connection line 154 can have a first test connection line 154a connecting a first end of the determination element 152 to the through-electrode 130 and a second test connection line 154b connecting a second end of the determination element 152 to an electrical ground. The determination element 152 can be, for example, any one of a light emitting element, a thermoelectric element, or a piezoelectric element. Accordingly, when a through-electrode is electrically connected to a corresponding pad part, current and/or voltage is provided to the determination element 152. The output of the determination element 152 may then indicate that the through-electrode is electrically connected to a corresponding pad part.

Accordingly, in a semiconductor chip fabricated in accordance with an embodiment of the present invention, it may be possible to test whether the through-electrodes and pad parts are electrically connected with each other.

Figure 2:
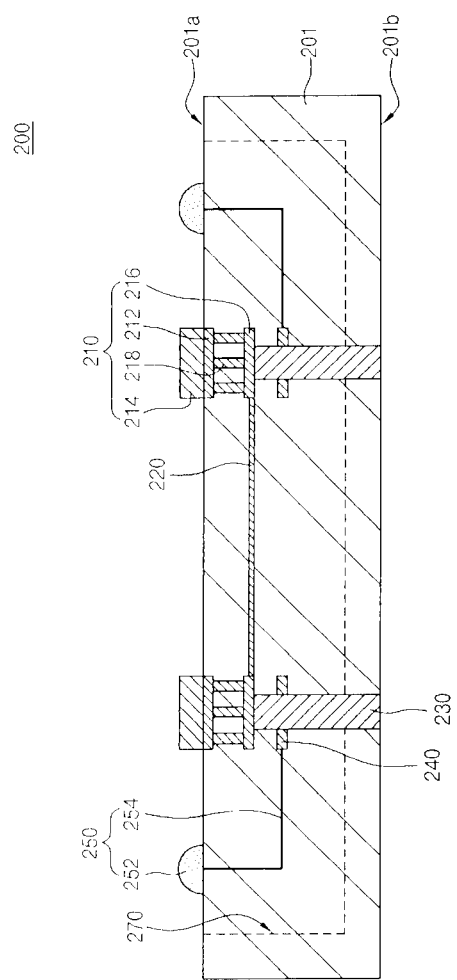
FIG. 2 is a cross-sectional view illustrating a semiconductor chip in accordance with an embodiment of the present invention.
Figure 3:
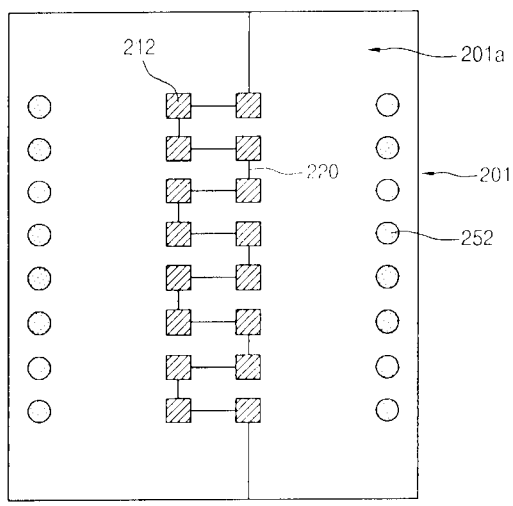
FIGS. 3 and 4 are plan views illustrating one surface of the semiconductor chip shown in FIG. 2.
Figure 4:
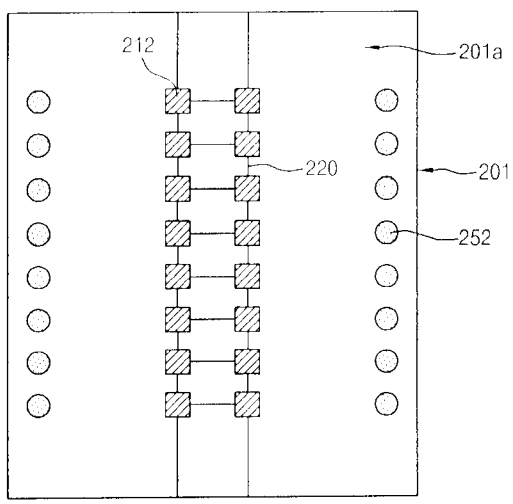

FIG. 2 is a cross-sectional view illustrating a semiconductor chip in accordance with an embodiment of the present invention, and FIGS. 3 and 4 are plan views illustrating one surface of the semiconductor chip shown in FIG. 2.

Referring to FIG. 2, there is shown a semiconductor chip 200 comprising a semiconductor chip body 201, connection lines 220, through-electrodes 230, and determination units 250. In addition, the semiconductor chip 200 can include test pads 240.

The semiconductor chip body 201 has a top surface 201a and a bottom surface 201b. The semiconductor chip body 201 includes pad parts 210 disposed on the top surface 201a and a circuit unit 270 connected with the pad parts 210. The circuit unit 270 can include a data storage section (not shown) for storing data and a data processing section (not shown) for processing the data stored in the data storage section.

Each of the pad parts 210 can have a first bonding pad 212 disposed on the top surface 201a of the semiconductor chip body 201, a connection member 214 on the first bonding pad 212, a second bonding pad 216 disposed in the semiconductor chip body 201, and via patterns 218 connecting the first bonding pad 212 to the second bonding pad 216. The connection member 214 may be, for example, a solder or a bump.

All the connection lines 220 can be connected with one another so that the pad parts 210 can have the same potential. The connection lines 220 may be electrically connected with the second bonding pads 216 of the pad parts 210. As shown in FIG. 3, the connection lines 220 can be disposed in a serial pattern when viewed from the top, and the pad parts 210 may be daisy chained via the connection lines 220. Or, as shown in FIG. 4, the connection lines 220 can be disposed in a matrix pattern when viewed from the top, in such a way as to be connected with all the pad parts 210. Accordingly, various configurations of the connection lines 220 may be used to connect the pad parts 210.

Referring again to FIG. 2, the test pads 240 can be disposed under the pad parts 210 in the semiconductor chip body 201. The test pads 240 can include material with good electrical conductivity such as, for example, copper or gold. The test pads 240 may be designed to be electrically insulated from the pad parts 210 and be disposed at positions near the pad parts 210.

The through-electrodes 230 are formed to be connected to the pad parts 210 and extend through the test pads 240 from the bottom surface 201b of the semiconductor chip body 201. In this case, the through-electrodes 230 and the test pads 240 can form "side contacts."

The determination units 250 are electrically connected with the respective test pads 240 and function to test whether the pad parts 210 and the through-electrodes 230 are electrically connected with each other. Each of the determination unit 250 includes a determination element 252 disposed on the top surface 201a or the bottom surface 201b of the semiconductor chip body 201 and a test connection line 254 which connects the determination element 252 to the test pad 240.

Although not shown, there is a ground line leading from the determination element 252, much as the second test connection line 154b in FIG. 1 is a ground line. There may be as many determination elements 252 as there are through-electrodes 230. The determination element 252 may be, for example, any one of a light emitting element, a thermoelectric element, and a piezoelectric element.

The connection lines 220 can include fuse circuits that may be selectively cut through laser cutting or electrical cutting. The connection lines 220 may be cut, for example, after testing whether the through-electrodes 230 and the pad parts 210 are electrically connected with each other. Thus, each of the pad parts 210 and its corresponding through-electrodes 230 can be electrically independent from each other.

This will be described below in detail with reference to a drawing.

Figure 5:
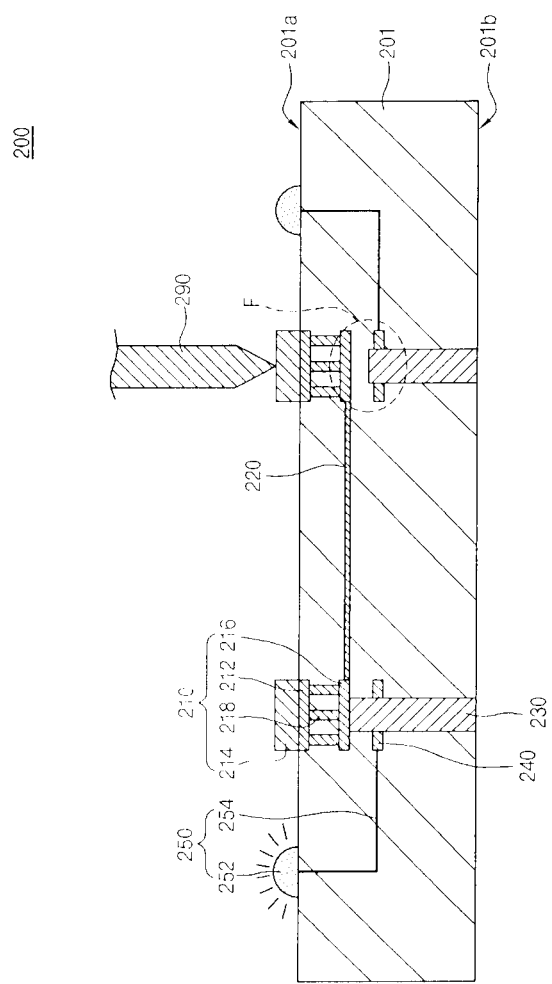
FIG. 5 is a cross-sectional view explaining a method of testing the semiconductor chip in accordance with an embodiment of the present invention.

FIG. 5 is a cross-sectional view explaining a method of testing the semiconductor chip in accordance with an embodiment of the present invention.

Referring to FIG. 5, if power is applied during testing by bringing a contact jig 290 into contact with at least one of the pad parts 210 of the semiconductor chip 200 in accordance with an embodiment of the present invention described in FIGS. 2-4, the pad parts 210 may have the same potential since they are all connected together by the connection lines 220.

As an example, when assuming that the determination elements 252 of the respective determination units 250 are light emitting elements, if the through-electrode 230 and the pad part 210 form a normal electrical connection, the light emitting element 252 connected to the through-electrode 230 may emit light as shown on the left side. If the through-electrode 230 and the pad part 210 form an abnormal electrical connection or are electrically disconnected from each other, as indicated by the reference character F on the right side, the light emitting element 252 connected to the disconnected through-electrode 230 does not emit light.

Accordingly, the semiconductor chip 200 in accordance with an embodiment of the present invention may be designed such that the determination elements 252 and the through-electrodes 230 define one-to-one correspondence. As a consequence, whether the respective through-electrodes 230 and the respective pad parts 210 are electrically connected with each other can be tested using the respective determination elements 252.

Therefore, in the semiconductor chip in accordance with an embodiment of the present invention, whether respective through-electrodes and respective pad parts are electrically connected with each other can be tested by the medium of determination units which generate any one of light, heat and vibration in response to external power application. Hence, a high responding speed can be accomplished when compared to the conventional probe test, and the reliability of a test, among others, can be improved since it is not necessary to read current or power.

Moreover, in an embodiment of the present invention described above, test circuits disposed in a semiconductor chip body can be simultaneously operated by applying power to a portion of pad parts. Accordingly, testing whether the pad parts and the through-electrodes are electrically connected with each other can be tested even under a fine pitch condition when only a portion of the pads may be accessed by a test fixture.

Figure 6:
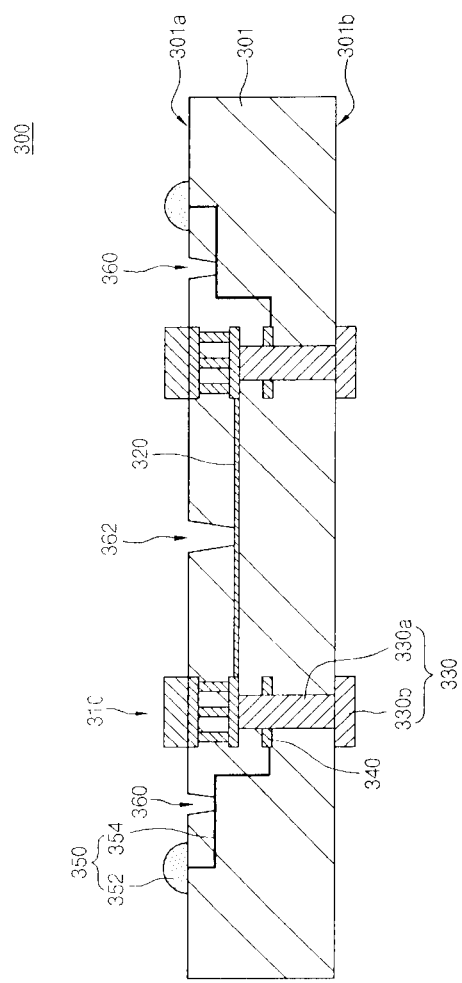
FIG. 6 is a cross-sectional view illustrating a semiconductor chip in accordance with an embodiment of the present invention.

FIG. 6 is a cross-sectional view illustrating a semiconductor chip in accordance with an embodiment of the present invention. The semiconductor chip described in FIG. 6 has substantially the same construction as the semiconductor chip described in FIGS. 2-5. Thus, repeated descriptions will be omitted, and only differences will be described.

Referring to FIG. 6, there is shown a semiconductor chip 300 comprising a semiconductor chip body 301 with first openings 360 exposing portions of test connection lines 354 and second openings 362 exposing portions of connection lines 320.

After testing whether pad parts 310 and through-electrodes 330 are electrically connected with each other is completed, the test connection lines 354 and the connection lines 320 of the semiconductor chip 300 may be cut using a laser cutting unit (not shown) along the first openings 360 and the second openings 362. Accordingly, the parts 310 and corresponding through-electrodes 330 may be separated from one another and from determination units 350. In the case where the connection lines 320 are cut not using a laser cutting unit, but through electrical cutting, the second openings 362 may not need to be defined.

The through-electrodes 330 can have through-parts 330a formed to pass from the bottom surface 301b to the top surface 301a of the semiconductor chip body 301, and extended parts 330b extending from the through-parts 330a to the outside of the bottom surface 301b of the semiconductor chip body 301.

Hereafter, a semiconductor chip capable of self-repair will be described.

Figure 7:
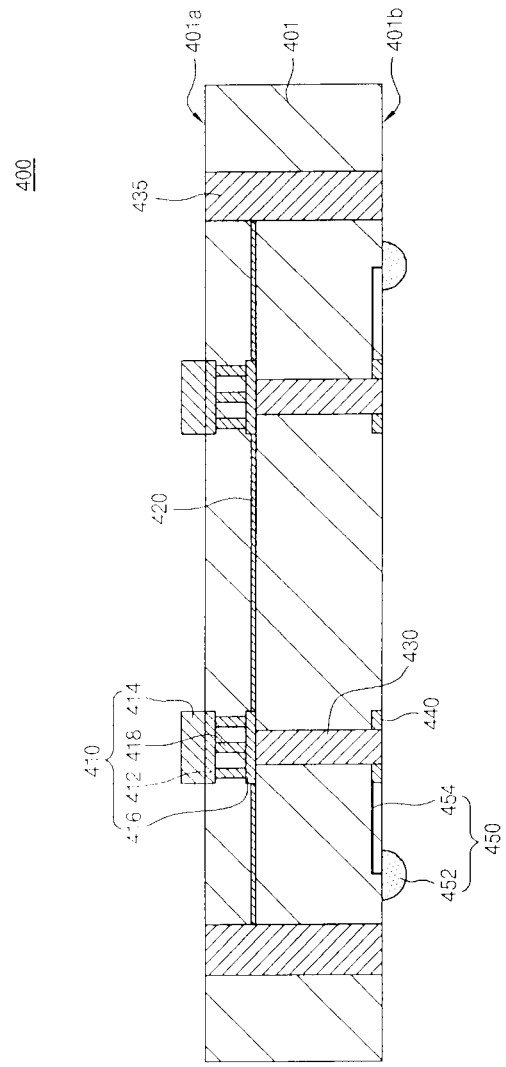
FIG. 7 is a cross-sectional view illustrating a semiconductor chip in accordance with an embodiment of the present invention.
Figure 8:
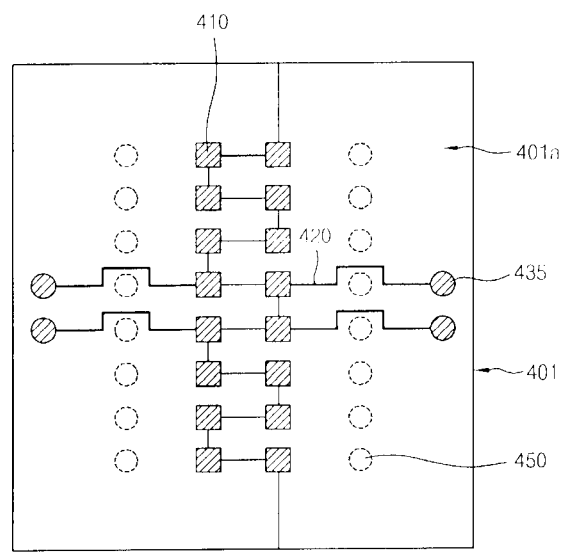
FIG. 8 is a plan view illustrating a top surface of the semiconductor chip shown in FIG. 7.
Figure 9:
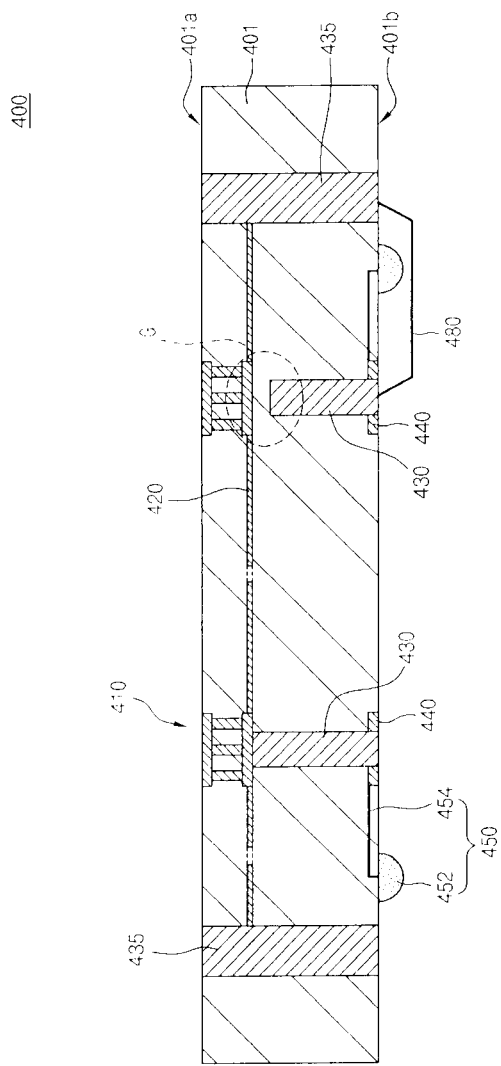
FIG. 9 is a cross-sectional view illustrating a state in which a semiconductor chip having a poor contact is repaired.
Figure 10:
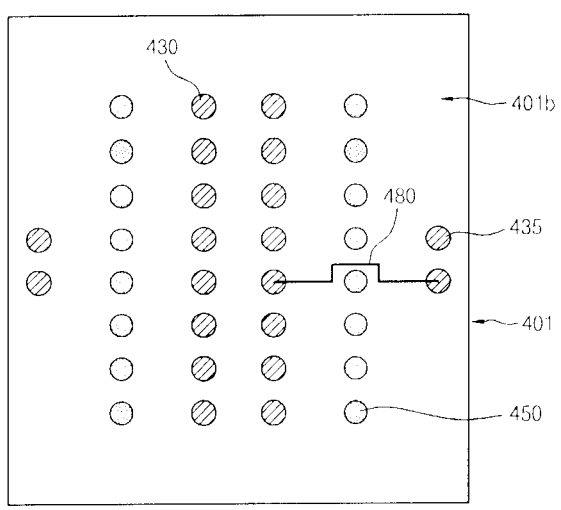
FIG. 10 is a bottom view illustrating a bottom surface of the semiconductor chip shown in FIG. 9.

FIG. 7 is a cross-sectional view illustrating a semiconductor chip in accordance with an embodiment of the present invention. FIG. 8 is a plan view illustrating a top surface of the semiconductor chip shown in FIG. 7. FIG. 9 is a cross-sectional view illustrating a state in which a semiconductor chip having a poor contact is repaired. FIG. 10 is a bottom view illustrating the bottom surface of the semiconductor chip shown in FIG. 9.

The semiconductor chip in accordance with an embodiment of the present invention has substantially the same construction as various semiconductor chips described with respect to FIGS. 1-6. Thus, repeated descriptions will be omitted, and only differences therebetween will be described.

Referring to FIG. 7, there is shown a semiconductor chip 400 comprising test pads 440 and determination units 450 formed on a bottom surface 401b of a semiconductor chip body 401. In this case, through-electrodes 430 can be formed to extend through the test pads 440 from the bottom surface 401b to connect with pad parts 410. Furthermore, the semiconductor chip 400 can include repair through-electrodes 435.

The repair through-electrodes 435 can be formed to pass through a top surface 401a and the bottom surface 401b outside the through-electrodes 430. The repair through-electrodes 435 may be formed to repair through-electrodes 430, and can have the same diameter as the through-electrodes 430. Alternatively, the repair through-electrodes 435 and the through-electrodes 430 may have different diameters.

Referring to FIGS. 7 and 8, connection lines 420 are formed to connect the pad parts 410 with one another and connect the pad parts 410 and the repair through-electrodes 435 with each other. The connection lines 420 can be disposed in a serial and/or matrix pattern when viewed from the top, such that they are connected with all the pad parts 410 and all the through-electrodes 435 for repair. The connection lines 420 can include fuse circuits that may be selectively cut through laser cutting or electrical cutting.

The through-electrodes 430 and the pad parts 410 can be disposed in two lines along the center portion of the semiconductor chip body 401. The through-electrodes 430 and the pad parts 410 can be disposed adjacent to both edges of the semiconductor chip body 401 or in one line along the center portion of the semiconductor chip body 401. The specific layout of the through-electrodes 430 and the pad parts 410 may be design dependent.

The through-electrodes 430 and the pad parts 410 are applied with data signals or power signals. For example, power signals can be applied to through-electrodes 430 disposed in first through third and sixth through eighth rows and the corresponding pad parts 410. Data signals can be applied, for example, to through-electrodes 430 disposed in fourth and fifth rows and the corresponding pad parts 410.

In general, poor contacts between power related through-electrodes 430 and the corresponding pad parts 410 may not adversely affect operation of the semiconductor chip 400. However, if poor contacts exist between some of the data signal carrying through-electrodes 430 and the corresponding pad parts 410, the operation of the semiconductor chip 400 may be seriously affected.

Therefore, where poor contacts are detected between the data carrying through-electrodes 430 and the corresponding pad parts 410, the through-electrodes 430 be repaired using a corresponding repair through-electrodes 435. The number of repair through-electrodes 435 may be the same as or less than the through-electrodes 430 applied with the data signals. However, the number of repair through-electrodes need not be limited so. For example, additional repair through-electrodes may be present for various application purposes including, for example, providing additional power and ground paths.

Referring to FIGS. 9 and 10, as a result of a test for checking electrical connections between the pad parts 410 and the through-electrodes 430, a through-electrode 430 in zone G may be identified as providing a poor electrical contact with the corresponding pad part 410. Accordingly, an alternate data path may be provided by using the repair through-electrode 435 by way of a repair line 480.

One end of the repair line 480 may be connected to the through-electrode 430 and the other end of the repair line 480 may be connected to the repair through-electrode 435. The repair line 480 can be disposed on the top surface 401a or the bottom surface 401b of the semiconductor chip body 401. The repair line 480 may comprise, for example, a metal pattern formed through a plating process or a metal wire.

After the repair process is completed, the connection lines 420 are selectively cut through laser cutting or electrical cutting. The connection lines 420 may be cut in such a manner that the pad parts 410 and the corresponding through-electrodes 430 are separated from other pad parts 410 and their corresponding through-electrodes 430.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
    a semiconductor chip body having a first surface on which pad parts are formed and an opposing second surface;
    connection lines connecting the pad parts with one another, wherein the connection lines comprise fuse circuits;
    test pads disposed under the pad parts in the semiconductor chip body;
    through-electrodes connected to the pad parts and formed to extend from the second surface of the semiconductor chip body through the test pads; and
    determination units enabled to determine whether the pad parts and the through-electrodes are electrically connected with each other.

2. The semiconductor chip according to claim 1, wherein each determination unit comprises:
    a determination element disposed on at least one of the first surface and the second surface of the semiconductor chip body; and
    a test connection line connecting the determination element to a corresponding test pad.

3. The semiconductor chip according to claim 2, wherein the determination element comprises any one of a light emitting element, a thermoelectric element, and a piezoelectric element.

4. The semiconductor chip according to claim 2, wherein the test connection line comprises:
    a first test connection line connecting the determination element to the corresponding through-electrode; and
    a second test connection line grounding the determination element.

5. The semiconductor chip according to claim 1, wherein the pad parts are connected in a daisy chain via the connection lines.

6. The semiconductor chip according to claim 1, wherein the semiconductor chip body has openings to expose portions of test connection lines for selective cutting using one of: laser cutting and electrical cutting.

7. A semiconductor chip comprising:
    a semiconductor chip body having a first surface on which pad parts are formed and an opposing second surface;
    connection lines connecting the pad parts with one another, wherein the connection lines comprise fuse circuits;
    test pads formed on the second surface of the semiconductor chip body;
    through-electrodes connected to the pad parts and formed to extend from the second surface of the semiconductor chip body through the test pads;
    repair-through electrode disposed in the semiconductor chip body; and determination units enabled to determine whether the pad parts and the through-electrodes are electrically connected with each other.

8. The semiconductor chip according to claim 7, wherein each determination unit comprises:
   a determination element disposed on at least one of the first surface and the second surface of the semiconductor chip body; and
   a test connection line connecting the determination element to a corresponding through-electrode.

9. The semiconductor chip according to claim 8, wherein the determination element comprises any one of a light emitting element, a thermoelectric element, and a piezoelectric element.

10. The semiconductor chip according to claim 8, wherein the test connection line comprises:
   a first test connection line connecting the determination element to the corresponding through-electrode; and
   a second test connection line grounding the determination element.

11. The semiconductor chip according to claim 7, wherein the pad parts are daisy chained together via the connection lines.

12. The semiconductor chip according to claim 7, wherein the through-electrodes are applied with data signals or power signals.

13. The semiconductor chip according to claim 7, wherein the through-electrodes and the repair through-electrodes are enabled to be connected with each other.

14. A semiconductor chip comprising:
   a semiconductor chip body having a first surface and a second surface being opposite to the first surface, wherein the semiconductor chip body includes a plurality of pad structures formed in the semiconductor chip body, and a plurality of through electrodes formed through the semiconductor chip body with coupling to the plurality of the pad structures, respectively;
   connecting lines coupled between the pad structures which are formed in same semiconductor chip body, wherein the connecting lines are formed in the semiconductor chip body;
   test pads formed in the semiconductor chip body and coupled to the through electrodes; and
   determination units enabled to determine whether the pad structures and the through-electrodes are electrically connected with each other.

15. The semiconductor chip according to claim 14, wherein the pad structure includes a first pad exposed from the first surface of the semiconductor chip body, and a second pad electrically coupled to the first pad and buried in the semiconductor chip body,
   wherein the connecting lines are coupled to the second pad of the pad structure.

* * * * *